(12) United States Patent
Hirano

(10) Patent No.: US 7,508,486 B2
(45) Date of Patent: Mar. 24, 2009

(54) EXPOSURE APPARATUS, EXPOSURE AND DEVELOPING SYSTEM, AND METHOD OF MANUFACTURING A DEVICE

(75) Inventor: Shinichi Hirano, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/950,862

(22) Filed: Dec. 5, 2007

(65) Prior Publication Data
US 2008/0137043 A1    Jun. 12, 2008

(30) Foreign Application Priority Data
Dec. 7, 2006    (JP)  ............................... 2006-331136

(51) Int. Cl.
*G03B 27/32*    (2006.01)
*G03B 27/42*    (2006.01)
*G03D 5/00*    (2006.01)

(52) U.S. Cl. ............................ 355/27; 355/53; 396/611

(58) Field of Classification Search .................... 355/27, 355/53; 396/611; 438/5
See application file for complete search history.

(56) References Cited
U.S. PATENT DOCUMENTS
7,008,124 B2 *   3/2006   Miyata ........................ 396/611
7,364,376 B2 *   4/2008   Sugimoto et al. ........... 396/611

* cited by examiner

*Primary Examiner*—Hung Henry Nguyen
(74) *Attorney, Agent, or Firm*—Locke Lord Bissell & Lidell LLP

(57) ABSTRACT

An exposure apparatus for exposing a substrate coated with a photosensitive material to radiant energy comprises a first controller and a second controller. The first controller is configured to control a process of exposing the substrate. The second controller is configured to generate a control signal corresponding to a time at which the substrate is exposed under a control by the first controller, and to transmit the control signal to a developing apparatus.

8 Claims, 8 Drawing Sheets

Wafer Flow Direction

| SUBSTRATE CONVEYANCE CONTROL PARAMETER | |
|---|---|
| SUBSTRATE CONVEYANCE CONTROL MODE | ☑ TIMING   ☐ SPEED |
| MEASUREMENT START TIMING | ☐ Expo Start  ☑ Expo End |
| MEASUREMENT START SHOT NUMBER | 1 |
| SET TIME | 6000 [mS] |
| DATA TRANSFER MODE | ☐ Yes  ☑ No |
| OPTIMAL TIME LEARNING MODE | ☑ Yes  ☐ No |
| LEARNING MODE SUBSTRATE COUNT | 25 |

EXPOSURE APPARATUS, EXPOSURE AND DEVELOPING SYSTEM, AND METHOD OF MANUFACTURING A DEVICE

BACKGROUND OF THE INVENTION

1. Field of the Invention

The present invention relates to an exposure apparatus, an exposure and developing system, and a method of manufacturing a device.

2. Description of the Related Art

In an exposure process, a substrate conveyance robot accommodated in a coating and developing apparatus chamber conveys a substrate coated with a photosensitive material from the coating and developing apparatus chamber to an exposure apparatus. The exposure apparatus exposes the substrate transferred from the coating and developing apparatus chamber. A substrate conveyance robot accommodated in the exposure apparatus transfers the exposed substrate to the coating and developing apparatus chamber again. Then, this substrate undergoes a post-exposure baking (PEB) process and a developing process.

The timing of substrate transfer between the exposure apparatus and the developing device changes in accordance with an apparatus operation state which depends on the times required for processes such as photosensitive material coating, substrate conveyance, substrate temperature control before exposure, exposure, PEB and development, as well as on the number of processed substrates. The exposure apparatus and the developing device perform control to maximize the processing speed in response to such a change in timing.

The inventors of the present invention found that, in an exposure and developing system formed by connecting the developing device and the exposure apparatus, a change in time from exposure until PEB or from exposure until development generates a variation in the line width of a manufactured semiconductor.

SUMMARY OF THE INVENTION

The present invention has been made on the basis of the above-described finding, and has as its object to, for example, decrease a variation in line width.

According to the first aspect of the present invention, there is provided an exposure apparatus which exposes a substrate coated with a photosensitive material, the apparatus comprising a first controller which controls a process of exposing the substrate, and a second controller which generates a control signal corresponding to a time at which the first controller exposes the substrate, and transmits the control signal to a developing device.

According to the second aspect of the present invention, there is provided an exposure and developing system comprising an exposure apparatus which exposes a substrate coated with a photosensitive material, and a developing device which develops the substrate exposed by the exposure apparatus, wherein the exposure apparatus comprises a first controller which generates a control signal corresponding to a time at which the substrate is exposed, and which transmits the control signal to the developing device, the developing device comprises a post-exposure baking unit which executes post exposure baking for the substrate exposed by the exposure apparatus, a developing unit which develops the substrate having undergone the post-exposure baking, and a second controller which controls the post-exposure baking unit and the developing unit, and the second controller receives the control signal, and starts either one of the post-exposure baking using the post-exposure baking unit or the development using the developing unit on the basis of the control signal upon elapse of a predetermined waiting time from the time at which the substrate is exposed.

According to the present invention, it is possible to, for example, decrease a variation in line width.

Further features of the present invention will become apparent from the following description of exemplary embodiments with reference to the attached drawings.

BRIEF DESCRIPTION OF THE DRAWINGS

FIG. 3 is a schematic view showing substrate conveyance control parameters displayed on an input/output window of a console input/output unit 20 as shown in FIG. 2;

DESCRIPTION OF THE EMBODIMENTS

Embodiments of the present invention will be described below with reference to the accompanying drawings.

Figure 1:
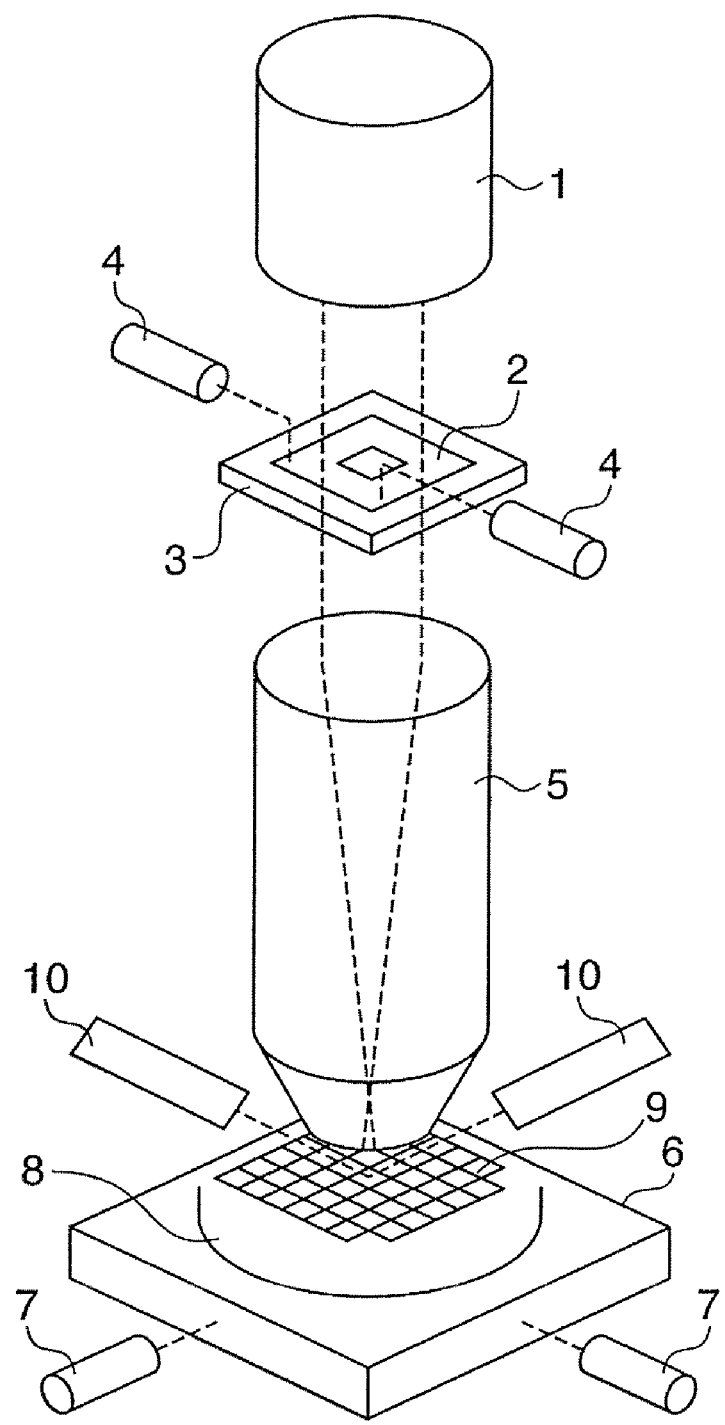
FIG. 1 is a schematic view showing an exposure apparatus according to an embodiment of the present invention.

FIG. 1 is a view showing the schematic arrangement of an exposure apparatus A which can be used in the present invention. The exposure apparatus A includes an illumination system 1, a reticle stage 3 which mounts a reticle 2, a projection optical system 5, an X-Y stage 6 which mounts a substrate 9, and a Z stage 8 which moves the substrate 9 in the vertical direction. The exposure apparatus A further includes, for example, a reticle position measurement device 4 which measures the position of the reticle 2 on the reticle stage 3, a laser interferometer 7 which measures the position of the X-Y stage 6, and an autofocus unit 10 which measures the focus position of the substrate 9.

Figure 2:
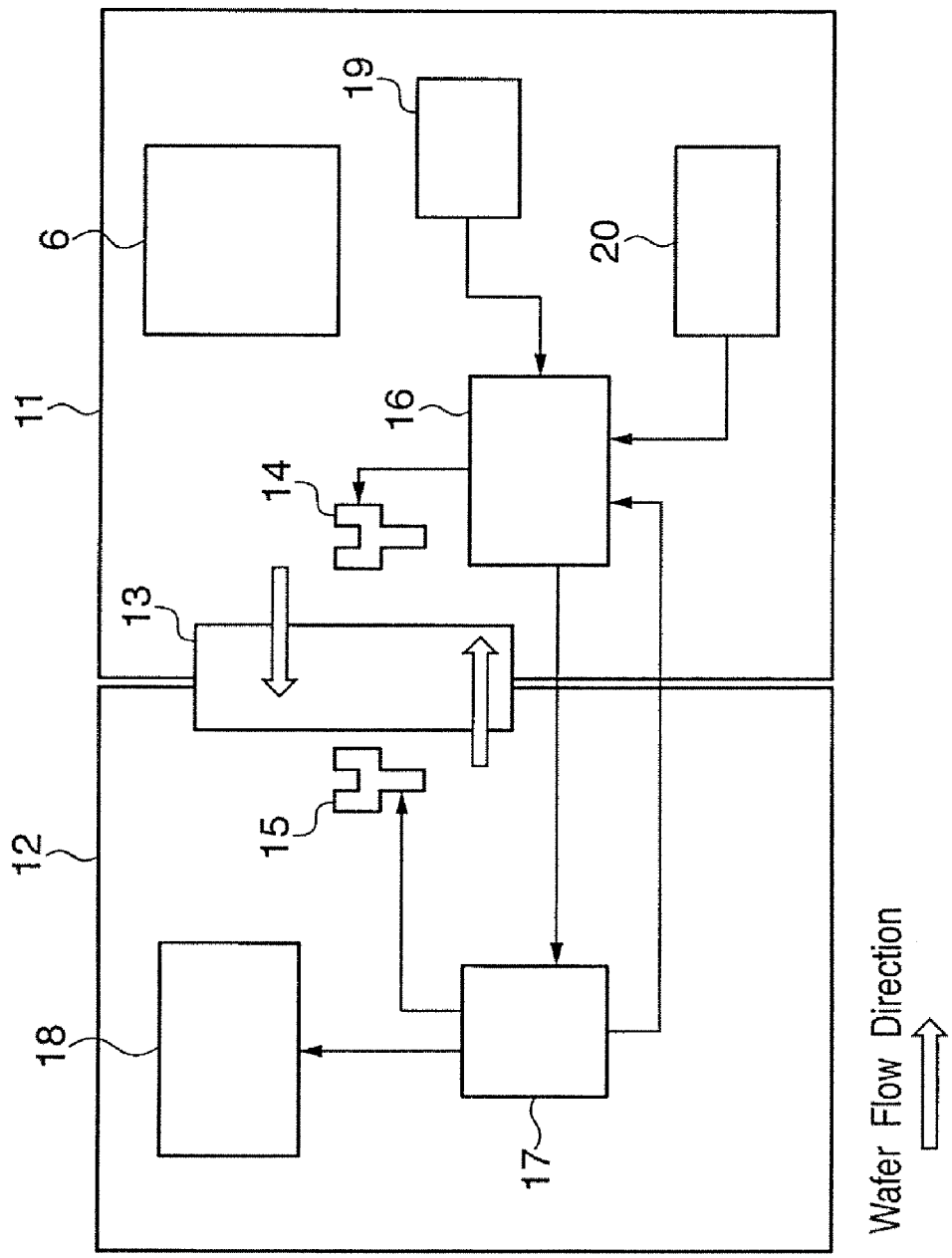
FIG. 2 is a schematic block diagram for explaining a substrate conveyance sequence from an exposure process until a PEB process.

As shown in FIG. 2, an exposure apparatus chamber 11 accommodates a conveyance hand 14, a computer 16 which controls the exposure apparatus, an exposure processing controller 19, and a console input/output unit 20, in addition to the exposure apparatus A. The exposure processing controller 19 is a first controller which controls a process of exposing the substrate 9. The computer 16 which controls the exposure apparatus is a second controller which generates a control signal in accordance with a time at which the exposure processing controller 19 (first controller) exposes the substrate, and transmits the control signal to a developing device. A coating and developing apparatus chamber 12 accommodates a substrate conveyance hand 15, a computer 17 which controls the coating and developing apparatus, and a post-exposure baking unit (to be referred to as a "PEB unit" hereinafter)

18, in addition to a coating unit and developing unit (not shown). In this embodiment, the coating and developing apparatus chamber 12 accommodates the coating unit, developing unit, and PEB unit 18. However, the present invention can also adopt a developing chamber which accommodates only a developing unit, or one which accommodates a developing unit and PEB unit.

The conveyance hand 14 receives a substrate 9 conveyed to a substrate transfer station 13 and conveys it to the X-Y stage 6. After exposure, the conveyance hand 14 conveys the substrate 9 to the substrate transfer station 13 again. A substrate alignment unit (not shown) can correct the position of the substrate 9 before the conveyance hand 14 conveys it to the X-Y stage 6. The exposure apparatus chamber can accommodate a plurality of conveyance hands 14.

Parameters displayed on an input/output window of the console input/output unit 20 will be exemplified with reference to FIG. 3.

A substrate conveyance mode is set by the "SUBSTRATE CONVEYANCE CONTROL MODE" parameter. If "TIMING" is checked, a time constant mode in which the time from the start or end of exposure until the substrate is discharged to the developing device is controlled to be constant is set. If "SPEED" is checked, a maximum speed mode in which the time from the start or end of exposure until the substrate is discharged to the developing device is controlled to be shortest is set. In the maximum speed mode, a substrate loaded from the coating and developing apparatus chamber is always processed, conveyed, and discharged to the coating and developing apparatus chamber in the shortest time.

A time control start timing is set by the "MEASUREMENT START TIMING" parameter. If "Expo Start" is checked, the measurement start timing is set at a specific shot exposure start time point. If "Expo End" is checked, the measurement start timing is set at a specific shot exposure end time point.

A shot for which time control starts is set by "MEASUREMENT START SHOT NUMBER" parameter. The measurement start timing is set at a time point at which the exposure of a shot having the set number starts or ends. If a value larger than an existing maximum shot number is input, this maximum shot number is used. If zero is input, the average of timings at which exposure starts or ends of all shots is used.

At a time input as the "SET TIME" parameter, the exposure apparatus decides the time difference between the start or end of exposure and a timing at which the substrate is discharged to the developing device. An optimal time free from any variation in line width between, for example, an exposure start timing and a timing at which the substrate is discharged to the developing device is measured in advance and input as the "SET TIME" parameter.

Exposure processing time information is transmitted to the developing device by the "DATA TRANSFER MODE" parameter to allow selecting and setting a mode in which both the exposure apparatus and the developing device perform time control, or a mode in which the exposure apparatus solely controls the timing of substrate transfer to the developing device. If "Yes" is checked, the exposure apparatus transfers the exposure processing time information to the developing device, and the developing device controls the time from exposure until PEB or development to be constant. If "No" is checked, control to transfer the exposure processing time information from the exposure apparatus to the developing device is not performed.

A mode in which the time from the start or end of exposure until the substrate is discharged to the developing device is selected and set by the "OPTIMAL TIME LEARNING MODE" parameter. If "Yes" is checked, the time from the start or end of exposure until the substrate is discharged to the developing device is measured. Using the measured time, the exposure apparatus discharges the substrate to the developing device from the start or end of exposure. If "No" is checked, the time from the start or end of exposure until the substrate is discharged to the developing device is not measured. In this case, the exposure apparatus discharges the substrate to the developing device by an amount of time after the start or end of exposure set by the "SET TIME" parameter.

The number of substrates when measuring the time from the start or end of exposure until the substrate is discharged to the developing device is set by the "LEARNING MODE SUBSTRATE COUNT" parameter. If "25" is set, the maximum time taken to process 25 substrates is extracted as a control time.

First Embodiment

Figure 4:
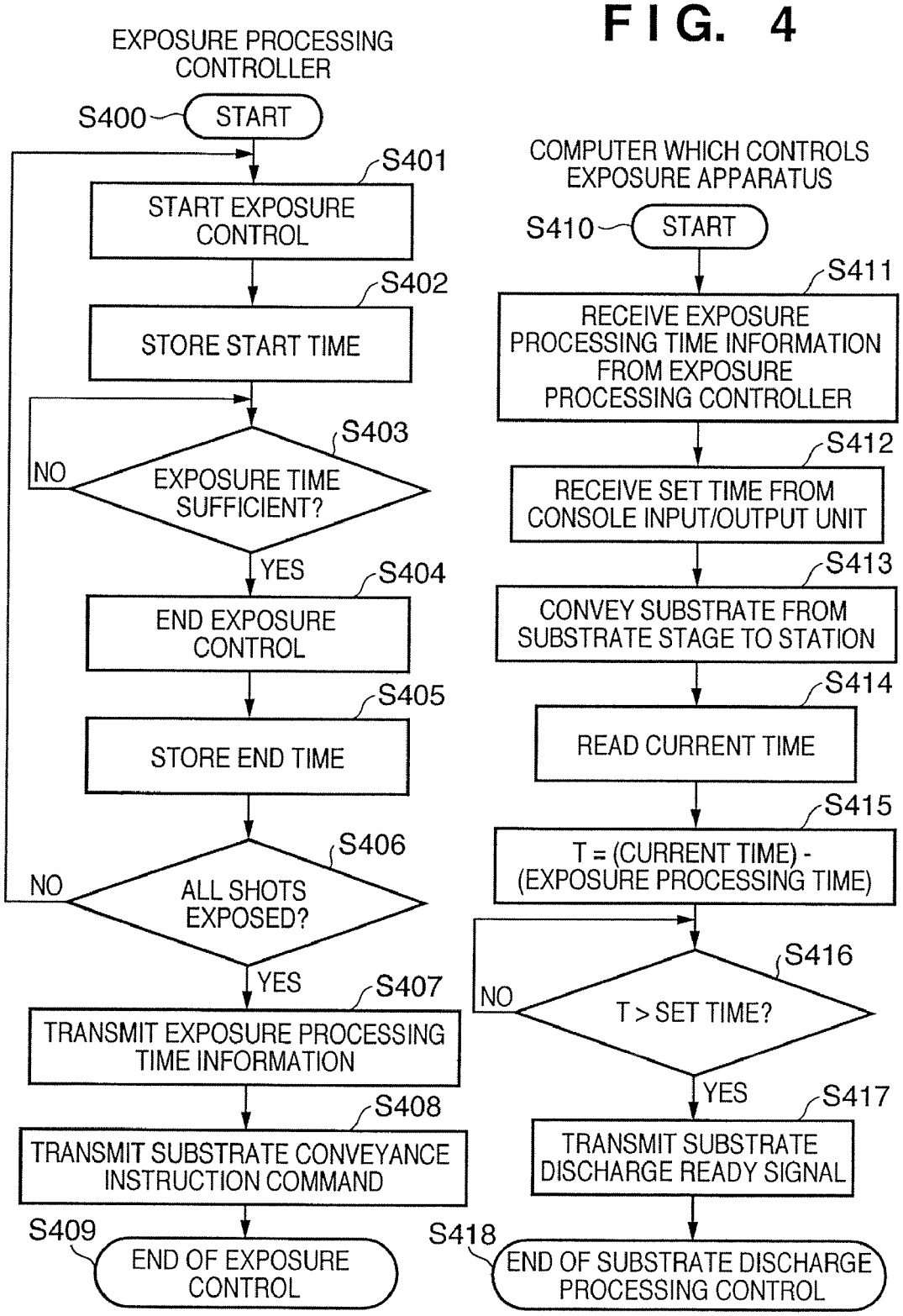
FIG. 4 is a flowchart illustrating a sequence for controlling the time from exposure until the exposed substrate is discharged to a developing device to be constant according to the first embodiment.

FIG. 4 is a flowchart illustrating a sequence for controlling the waiting time until a substrate exposed by an exposure apparatus is discharged to a developing device to be constant.

In step S400, an exposure processing controller 19 starts control. In step S401, exposure control for individual exposure areas (shots) divided on a substrate coated with a photosensitive material starts. In step S402, a memory of the exposure processing controller 19 stores an exposure control start time and the individual exposure area numbers (shot numbers). In step S403, the exposure processing controller 19 determines whether a time sufficient to irradiate the substrate with a predesignated amount of exposure light has elapsed. If a sufficient amount of time has elapsed, the exposure processing controller 19 executes the processing procedure in step S404. If the sufficient amount of time has not yet elapsed, the exposure processing controller 19 executes the processing procedure in step S403 again. In step S404, the exposure processing controller 19 ends exposure control for the individual exposure areas. In step S405, the exposure processing controller 19 stores an exposure control end time and the individual exposure area numbers.

In step S406, the exposure processing controller 19 determines whether all the scheduled exposure areas of the substrate have been exposed. If all the exposure areas have been exposed, the exposure processing controller 19 executes the processing procedure in step S407. If not all the exposure areas have been exposed, the exposure processing controller 19 moves an X-Y stage 6 to the next exposure area and executes the processing procedure in step S401. In step S407, the exposure processing controller 19 transmits, to a computer 16 which controls the exposure apparatus, exposure processing time information extracted in accordance with the "MEASUREMENT START TIMING" parameter and the "MEASUREMENT START SHOT NUMBER" parameter set via a console input/output unit 20. For example, if the "MEASUREMENT START TIMING" parameter is "Expo End" and the "MEASUREMENT START SHOT NUMBER" parameter is "1", the exposure processing time information is the time taken to expose the first shot on the substrate. In step S408, the exposure processing controller 19 transmits a substrate conveyance instruction command to the computer 16 which controls the exposure apparatus. In step S409, the exposure processing controller 19 ends control.

In step S410, the computer 16 that controls the exposure apparatus starts control. In step S411, the computer 16 receives the exposure processing time information acquired in step S407 from the exposure processing controller 19. In step S412, the computer 16 receives the value of the "SET TIME" parameter set via the console input/output unit 20. In step S413, the computer 16 acquires an exposed substrate 9 from a Z stage 8 arranged on the X-Y stage 6, and conveys it to a substrate transfer station 13. In step S414, using a built-in clock, the computer 16 reads a current time defined as the time elapsed from the start of exposure.

In step S415, the computer 16 that controls the exposure apparatus calculates, as a waiting time, the time difference between the exposure processing time information received in step S411 and the current time read in step S414. The computer 16 determines in step S416 whether the waiting time calculated in step S415 is longer than the value of the "SET TIME" parameter received in step S412. If the computer 16 determines that the waiting time is longer than the value of the "SET TIME" parameter, it executes the processing procedure in step S417. If the computer 16 determines that the waiting time is less than or equal to the value of the "SET TIME" parameter, it executes the processing procedure in step S416 again. In step S417, a signal providing unit of the computer 16 which controls the exposure apparatus transmits a substrate discharge ready signal to a computer 17 that controls a coating and developing apparatus. In step S418, the computer 16 ends substrate discharge processing control.

In the first embodiment, a substrate exposure time is defined as a time at which the exposure of the first shot on the substrate is ended. However, the substrate exposure time may be defined as an exposure start time in place of the exposure end time. It is also possible to define the substrate exposure time as an arbitrary specific shot exposure time in place of the time at which the first shot on the substrate is exposed. It is also possible to define the substrate exposure time as the average of times at which all shots are exposed in place of the specific shot exposure time.

In the first embodiment, a time signal indicating a representative time at which an event included in the substrate exposure process occurs includes a signal indicating an exposure end time. This time signal may be a signal indicating not the exposure end time but an exposure start time.

Second Embodiment

Figure 5:
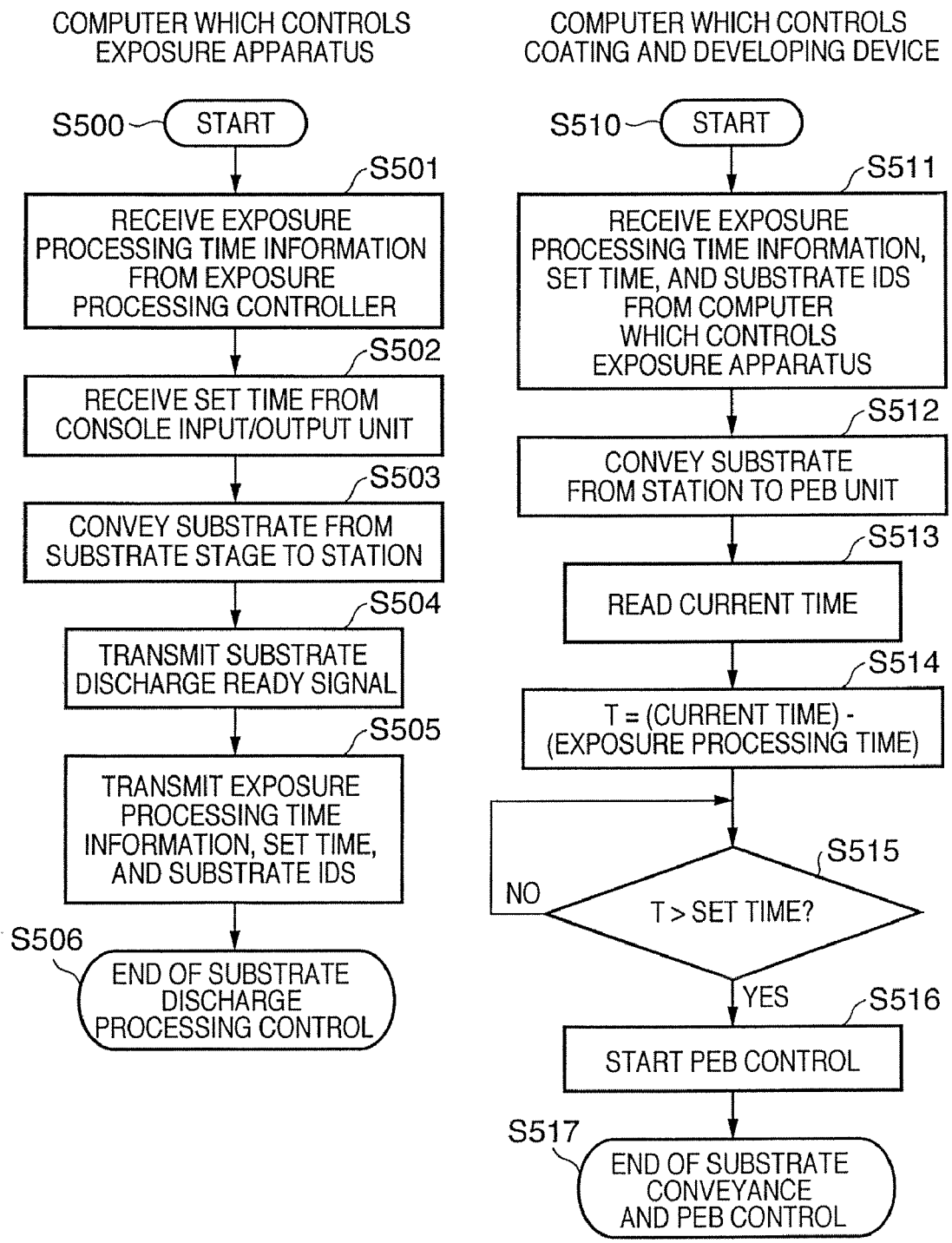
FIG. 5 is a flowchart illustrating a sequence for controlling the time from exposure until PEB to be constant according to the second embodiment.

FIG. 5 is a flowchart illustrating a sequence when an exposure apparatus A transfers exposure processing time information to a developing device B and the developing device B controls the waiting time from exposure until PEB to be constant.

In step S500, a computer 16 that controls the exposure apparatus starts control. In step S501, the computer 16 receives exposure processing time information from an exposure processing controller 19. The exposure processing time information indicates a value obtained by the exposure processing controller 19 in accordance with the processing procedure in step S407. In step S502, the computer 16 receives the value of a "SET TIME" set via a console input/output unit 20. In step S503, the computer 16 acquires an exposed substrate 9 from a Z stage 8 arranged on an X-Y stage 6, and conveys it to a substrate transfer station 13. In step S504, a signal providing unit of the computer 16 which controls the exposure apparatus transmits a substrate discharge ready signal to a computer 17 which controls a coating and developing apparatus. The computer 17 that controls the coating and developing apparatus controls a PEB process and a developing process. In step S505, the signal providing unit transmits, to the computer 17 which controls the coating and developing apparatus, the exposure processing time information obtained in step S501, the value of the "SET TIME" parameter obtained in step S502, and information on substrate IDs allocated to the respective substrates. In step S506, the computer 16 which controls the exposure apparatus ends substrate discharge processing control.

In step S510, the computer 17 which controls the coating and developing apparatus starts control for acquiring and conveying a substrate from the exposure apparatus. In step S511, the computer 17 receives, from the exposure apparatus, the exposure processing time information transmitted in step S505, the value of the "SET TIME" parameter, and the information on the substrate IDs allocated to the respective substrates. The information on the substrate IDs is used to associate time control target substrates with the exposure processing time information and the value of the "SET TIME" parameter. In step S512, the computer 17 controls a PEB unit 18 to convey the substrate 9 located on the substrate transfer station 13. In step S513, using a built-in clock, the computer 17 reads a current time defined as the time elapsed from the start of exposure.

In step S514, the computer 17 which controls the coating and developing apparatus calculates, as a waiting time, the time difference between the exposure processing time information received in step S511 and the current time read in step S513. The computer 17 determines in step S515 whether the waiting time calculated in step S514 is longer than the value of the "SET TIME" parameter received in step S511. If the computer 17 determines that the waiting time is longer than the value of the "SET TIME" parameter, it executes the processing procedure in step S516. If the computer 17 determines that the waiting time is equal to or shorter than the value of the "SET TIME" parameter, it executes the processing procedure in step S515 again. In step S516, the computer 17 transmits a PEB execution signal for instructing to start the PEB process to the PEB unit 18. In step S517, the computer 17 ends control for acquiring and conveying a substrate from the exposure apparatus. In the above-described way, the computer 16 which controls the exposure apparatus cooperates with the computer 17 which controls the coating and developing apparatus. This makes it possible to reduce the delay in throughput as compared with a method in which both the apparatuses individually control times to be constant. It is also possible to control the time until a just exposed substrate undergoes PEB to be constant.

Examples of a technique for transmitting information between the exposure apparatus and the developing device are a method using a communication path formed by directly connecting the two apparatuses, and a method of transmitting information via a network without direct connection. These two methods produce similar effects.

As described above, the computer 17 which controls the coating and developing apparatus controls the waiting time until an exposed substrate starts undergoing the PEB process to be constant. The waiting time until the developing process starts can also be controlled to be constant in the same way.

Third Embodiment

Figure 6:
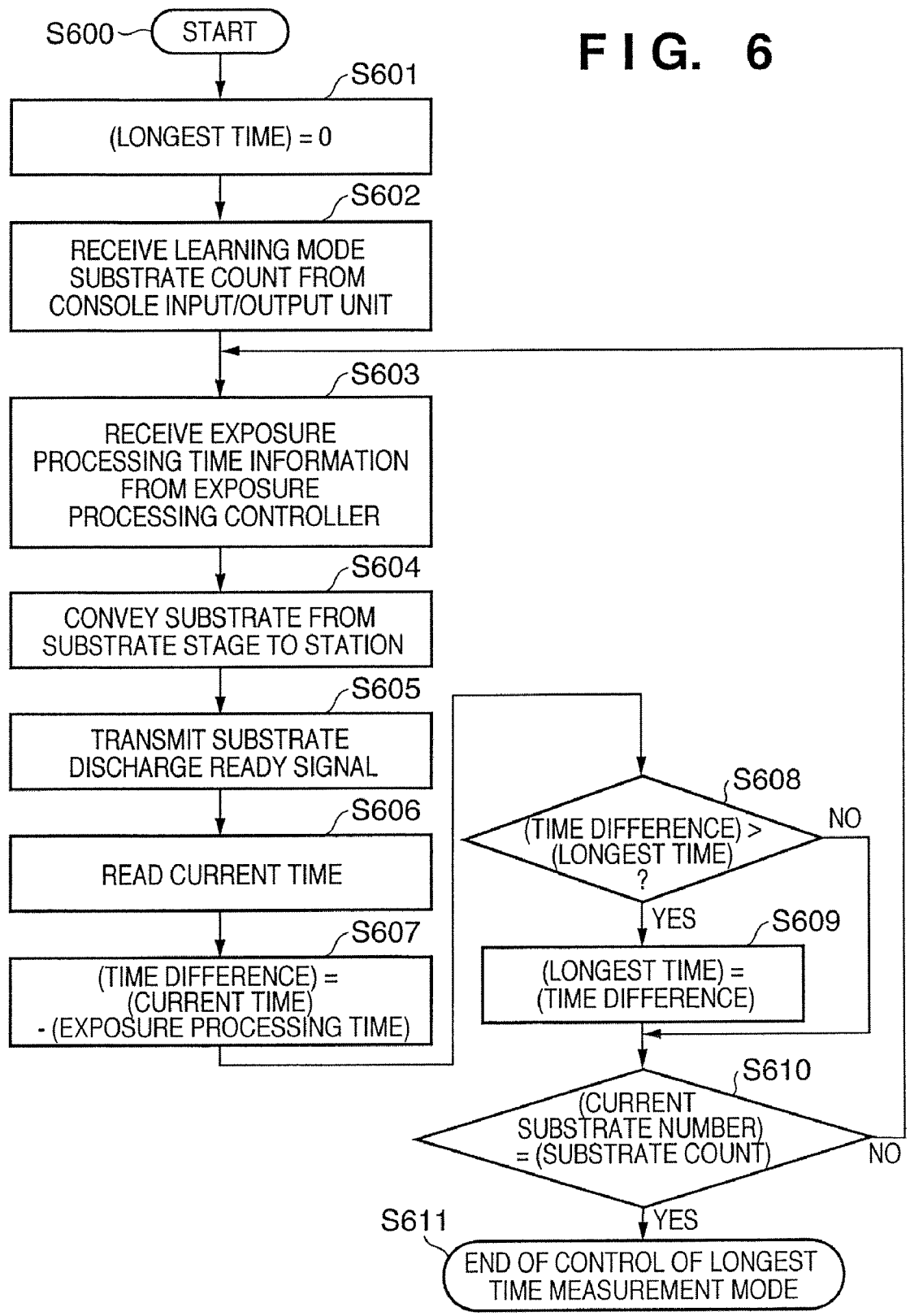
FIG. 6 is a flowchart illustrating a sequence for controlling a mode in which the longest time taken to discharge a substrate exposed by an exposure apparatus to a developing device is measured.

FIG. 6 is a flowchart illustrating a sequence for controlling a mode in which the maximum time (longest time) taken to discharge a substrate to a developing device from a substrate exposure time is measured.

In step S600, a measurement unit of a computer 16 which controls an exposure apparatus starts control of a longest time measurement mode. In step S601, the measurement unit initializes the variable of a longest time to zero. In step S602, the measurement unit receives the value of a "LEARNING MODE SUBSTRATE COUNT" parameter which is set via a console input/output unit 20 and designates the number of substrates to be used for longest time measurement. In step S603, the measurement unit receives exposure processing time information from an exposure processing controller 19. In step S604, the measurement unit acquires an exposed substrate 9 from a Z stage 8 arranged on an X-Y stage 6, and conveys it to a substrate transfer station 13. In step S605, the computer 16 which controls the exposure apparatus transmits a substrate discharge ready signal to a computer 17 which controls the coating and developing apparatus.

In step S606, using a clock built in the computer 16 which controls the exposure apparatus, the measurement unit reads a current time defined as the time elapsed from the start of exposure.

In step S607, the measurement unit calculates, as a waiting time, the time difference between the exposure processing time information received in step S603 and the current time read in step S606. The measurement unit determines in step S608 whether the waiting time calculated in step S607 is longer than the variable of the longest time. If the measurement unit determines that the waiting time is longer than the variable of the longest time, it executes the processing procedure in step S609. If the measurement unit determines that the waiting time is equal to or shorter than the variable of the longest time, it executes the processing procedure in step S610. In step S609, the measurement unit substitutes the waiting time calculated in step S607 for the variable of the longest time. In step S610, the measurement unit confirms the substrate count from the start of control of the mode in which the maximum time (longest time) until discharge is measured. If the measurement unit determines that the substrate count is equal to the value of the "LEARNING MODE SUBSTRATE COUNT" parameter received in step S602, it executes the processing procedure in step S611; otherwise, it executes the processing procedure in step S603 again. At the time of the processing procedure in step S611, the maximum time (longest time) taken to be ready to discharge an exposed substrate to the developing device is stored. In step S611, the measurement unit of the computer 16 which controls the exposure apparatus ends control of the longest time measurement mode. The measurement unit of the computer 16 which controls the exposure apparatus substitutes a "SET TIME" of the waiting time for the decided maximum time (longest time), and executes the process shown in FIG. 4. This makes it possible to control the time until a substrate exposed by the exposure apparatus is discharged to the developing device to be constant using the longest time after completing the measurement process shown in FIG. 6.

In the flowchart shown in FIG. 6, the process (S606) of reading the current time using the clock built in the computer 16 which controls the exposure apparatus is done after transmitting a substrate discharge ready signal. However, this process may be done at a timing at which a substrate detection sensor (not shown) built in the substrate transfer station 13 actually acquires a substrate from the substrate conveyance hand 15 of the coating and developing apparatus.

The above-described scheme sets the waiting time to an optimal value. This makes it possible to minimize the delay in throughput and to control the time until an exposed substrate is discharged to the developing device.

Embodiment of Device Manufacture

An embodiment of a method of manufacturing a device using the above-described exposure apparatus will be explained next with reference to FIGS. 7 and 8.

Figure 7:
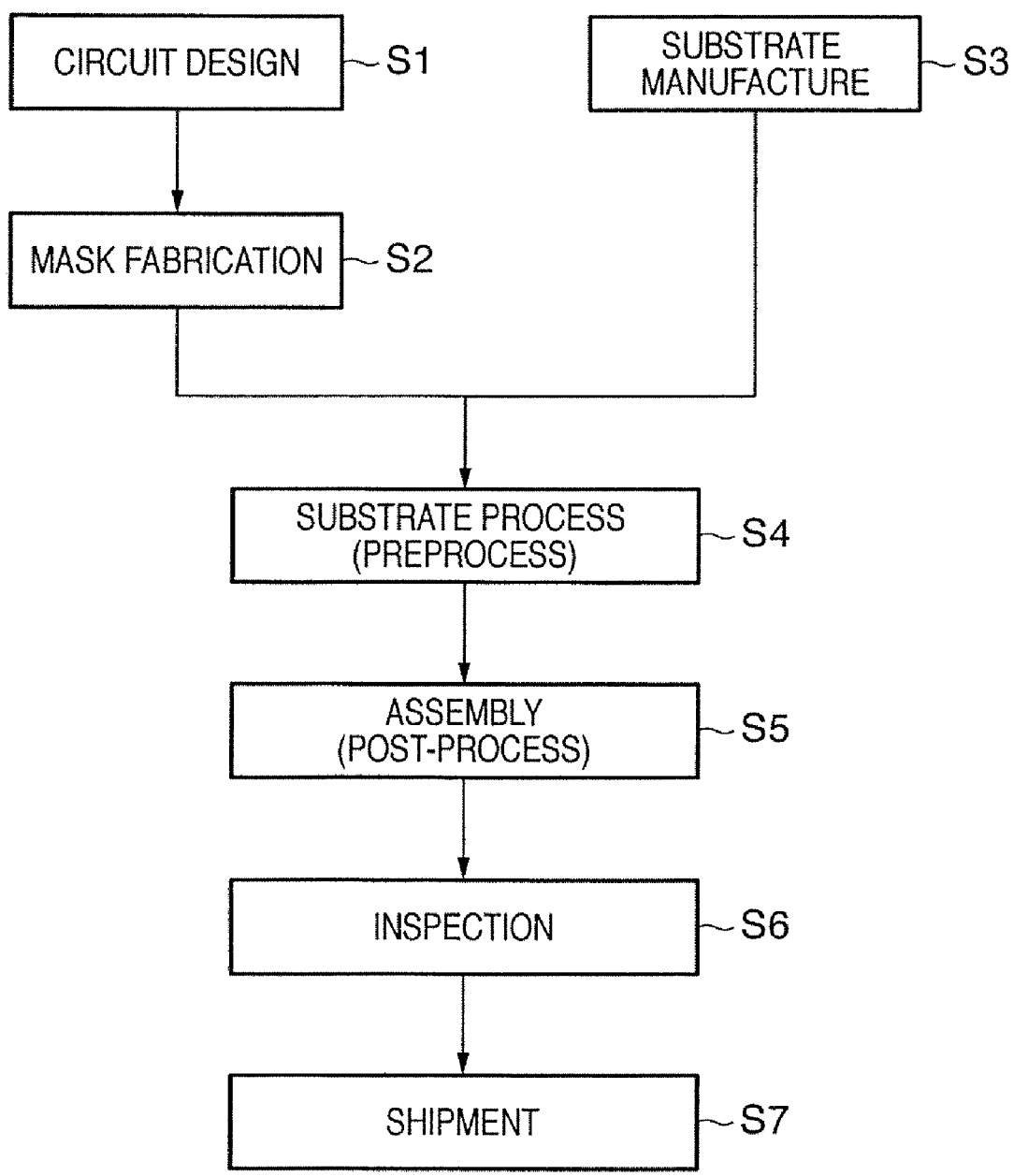
FIG. 7 is a flowchart for explaining the device manufacture using an exposure apparatus.

FIG. 7 is a flowchart for explaining the manufacture of a device (e.g., a semiconductor chip such as an IC or LSI, an LCD, or a CCD). A semiconductor chip manufacturing method will be exemplified here.

In step S1 (circuit design), the circuit of a semiconductor device is designed. In step S2 (mask fabrication), a mask is fabricated on the basis of the designed circuit pattern. In step S3 (substrate manufacture), a substrate is manufactured using a material such as silicon. In step S4 (substrate process) called a preprocess, the above-described exposure apparatus forms an actual circuit on the substrate by lithography using the mask and substrate. In step S5 (assembly) called a postprocess, a semiconductor chip is formed using the substrate manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped in step S7.

Figure 8:
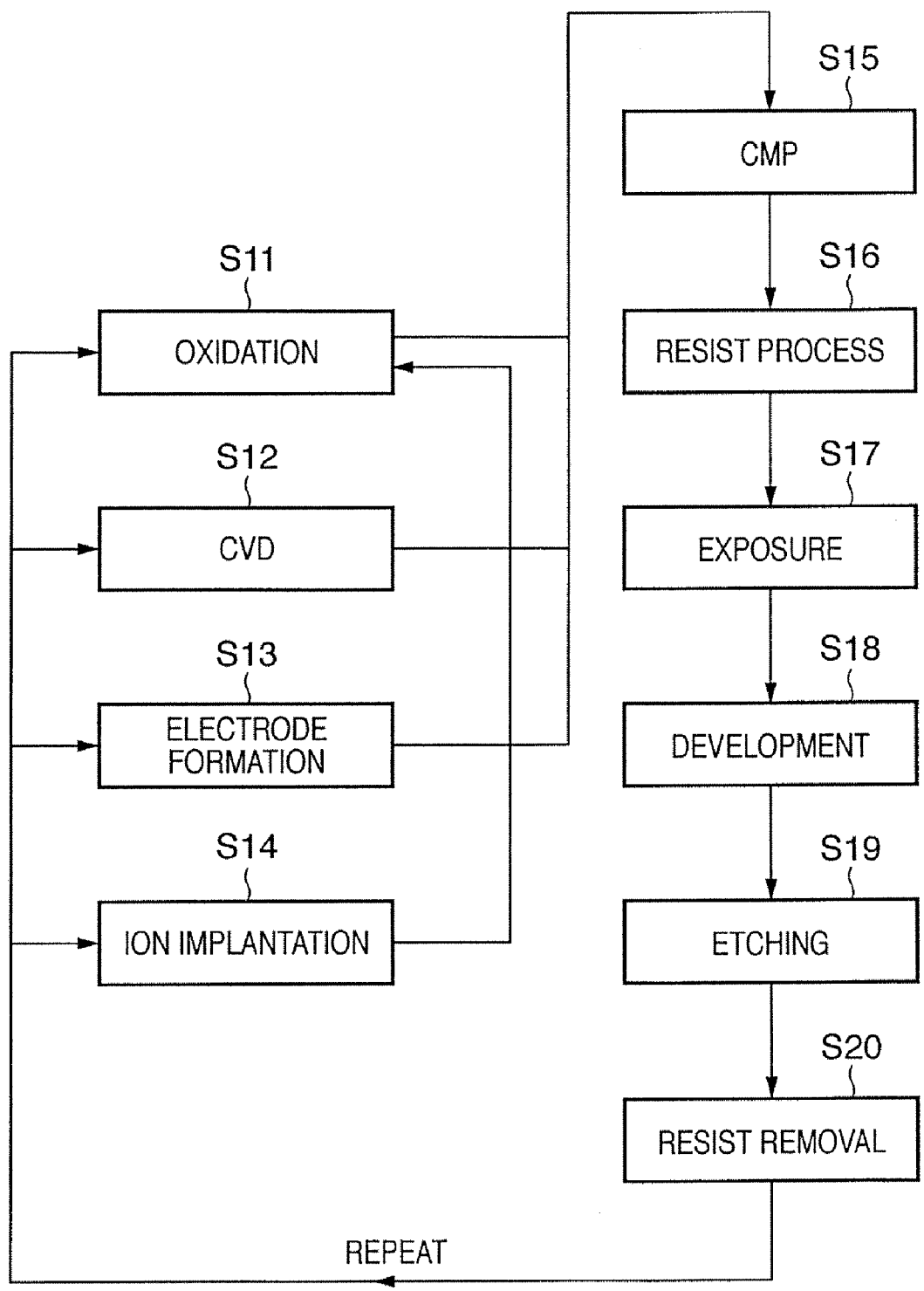
FIG. 8 is a flowchart illustrating details of the substrate process in step S4 of the flowchart shown in FIG. 7.

FIG. 8 is a flowchart illustrating details of the substrate process in step S4. In step S11 (oxidation), the substrate surface is oxidized. In step S12 (CVD), an insulating film is formed on the substrate surface. In step S13 (electrode formation), an electrode is formed on the substrate by deposition. In step S14 (ion implantation), ions are implanted into the substrate. In step S15 (resist process), a photosensitive agent is applied to the substrate. In step S16 (exposure), the exposure apparatus transfers the circuit pattern of the mask onto the substrate by exposure. In step S17 (post-exposure baking), the exposed substrate undergoes a post-exposure baking (PEB) process. In step S18 (development), the substrate having undergone the PEB process is developed.

In this embodiment, upon the elapse of a predetermined waiting time from a substrate exposure time, the exposed substrate is unloaded, the PEB process starts, or the developing process starts.

In step S19 (etching), portions other than the developed resist image are etched. In step S20 (resist removal), any unnecessary resist remaining after etching is removed. By repeating these steps, a multilayered structure of circuit patterns is formed on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-331136, filed Dec. 7, 2006, which is hereby incorporated by reference herein in its entirety.

What is claimed is:

1. An exposure and developing system comprising:
   an exposure apparatus for exposing a substrate coated with a photosensitive material to radiant energy;
   a developing apparatus for performing a post-exposure baking process;
   a first controller, part of the exposure apparatus, configured to control a process of exposing the substrate; and
   a second controller, part of the exposure apparatus, configured to generate a ready signal, which indicates that the exposure apparatus is ready to discharge the substrate upon elapse of the predetermined waiting time from the time at which the substrate is exposed, and to transmit the ready signal to the developing apparatus.

2. An exposure and developing system according to claim 1, wherein the second controller is configured to measure a time taken to be ready to discharge the substrate to the developing apparatus from the time at which the substrate is exposed, and to set the waiting time based on the measured time.

3. A method of manufacturing a device, the method comprising:
   exposing a substrate to radiant energy using an exposure apparatus defined in claim 1;
   developing the exposed substrate; and
   processing the developed substrate to manufacture the device,
   wherein the developing step starts a process associated with development of the substrate based on the control signal.

4. A method according to claim 3, wherein the process associated with the development of the substrate is one of a process of unloading the substrate from the exposure apparatus, a post-exposure baking process for the substrate, and a developing process for the substrate.

5. An exposure and developing system comprising:
   an exposure apparatus for exposing a substrate coated with a photosensitive material to radiant energy;
   a developing apparatus for performing a post-exposure baking process;
   a first controller, part of the exposure apparatus, configured to control a process of exposing the substrate; and
   a second controller, part of the exposure apparatus, configured to generate a control signal corresponding to a time which indicates the time at which the substrate is exposed under a control by the first controller, and to transmit the control signal directly to the developing apparatus.

6. An exposure and developing system according to claim 5, wherein the time signal indicates a time at which a predetermined shot region on the substrate is exposed.

7. An exposure and developing system comprising an exposure apparatus for exposing a substrate coated with a photosensitive material to radiant energy, and a developing apparatus for developing the substrate exposed by the exposure apparatus, wherein
   the exposure apparatus comprises a first controller configured to generate a control signal corresponding to a time at which the substrate is exposed, and to transmit the control signal to the developing apparatus,
   the developing apparatus comprises a post-exposure baking unit configured to execute post-exposure baking for the substrate exposed by the exposure apparatus, a developing unit configured to develop the substrate having undergone the post-exposure baking, and a second controller configured to control the post-exposure baking unit and the developing unit, and
   said second controller is configured to receive the control signal directly from the first controller, and to cause one of the post-exposure baking by the baking unit and the development by the developing unit to start based on the control signal upon elapse of a predetermined waiting time from the time at which the substrate is exposed.

8. An exposure apparatus for exposing a substrate coated with a photosensitive material to radiant energy, the apparatus comprising:
   a first controller configured to control a process of exposing the substrate; and
   a second controller configured to generate a ready signal, which indicates that the exposure apparatus is ready to discharge the substrate, as the control signal, upon elapse of a predetermined waiting time from the time at which the substrate is exposed, and to transmit the ready signal to a developing apparatus.

* * * * *